(12) United States Patent
Williams

(10) Patent No.: US 11,047,878 B2
(45) Date of Patent: Jun. 29, 2021

(54) ELECTRICAL CONNECTOR

(71) Applicant: GITech Inc., Austin, TX (US)

(72) Inventor: John Williams, Austin, TX (US)

(73) Assignee: GITech Inc., Austin, TX (US)

( * ) Notice: Subject to any disclaimer, the term of this patent is extended or adjusted under 35 U.S.C. 154(b) by 0 days.

(21) Appl. No.: 16/246,529

(22) Filed: Jan. 13, 2019

(65) Prior Publication Data

US 2019/0331712 A1 Oct. 31, 2019

(30) Foreign Application Priority Data

Apr. 30, 2018 (TW) .................................. 107114634
May 17, 2018 (CN) .......................... 201810474999.1

(51) Int. Cl.
| | |
|---|---|
| *G01R 1/04* | (2006.01) |
| *H01R 13/24* | (2006.01) |
| *H01R 33/74* | (2006.01) |
| *H01R 13/631* | (2006.01) |

(52) U.S. Cl.
CPC ....... *G01R 1/0466* (2013.01); *H01R 13/2407* (2013.01); *H01R 33/74* (2013.01); *H01R 13/631* (2013.01); *H01R 2201/20* (2013.01)

(58) Field of Classification Search
CPC .. G01R 1/0466; H01R 13/2407; H01R 33/74; H01R 2201/20; H01R 13/631; H01R 13/2435; H01R 12/7082
See application file for complete search history.

(56) References Cited

U.S. PATENT DOCUMENTS

| | | | |
|---|---|---|---|
| 5,628,635 | A | 5/1997 | Ikeya |
| 6,400,169 | B1 | 6/2002 | Hembree |
| 6,559,665 | B1 | 5/2003 | Barabi |
| 7,722,361 | B2 | 5/2010 | Lopez et al. |
| 7,932,805 | B2 * | 4/2011 | Darr ........................ H01H 85/30 337/243 |
| 7,956,631 | B2 | 6/2011 | Chen et al. |
| 7,989,945 | B2 | 8/2011 | Williams et al. |
| 2004/0252477 | A1 | 12/2004 | Brown |

(Continued)

FOREIGN PATENT DOCUMENTS

| | | |
|---|---|---|
| CN | 2927364 Y | 7/2007 |
| CN | 201438572 U | 4/2010 |

(Continued)

OTHER PUBLICATIONS

Office Action and Search Report for China Application No. 201810474999.1, dated May 28, 2020, 8 pages.

(Continued)

*Primary Examiner* — Alvaro E Fortich
*Assistant Examiner* — Zannatul Ferdous
(74) *Attorney, Agent, or Firm* — Carmen C. Cook

(57) ABSTRACT

An electrical connector comprises a substrate, a datum reference position, a first plurality of intermediary members, and a first plurality of contact members. Each contact member has first and second arms extending away from a base towards opposite side surfaces to form a letter V with an opening facing the datum reference position. A connector array comprises one or more of the electrical connectors. A testing apparatus comprises a tester base, a supporting member, a frame, one or more of the connector arrays, and an upper cover.

14 Claims, 10 Drawing Sheets

(56) References Cited

U.S. PATENT DOCUMENTS

| | | | |
|---|---|---|---|
| 2006/0079108 A1* | 4/2006 | McCoy | H01R 24/20 |
| | | | 439/284 |
| 2007/0275572 A1 | 11/2007 | Williams et al. | |
| 2011/0212641 A1* | 9/2011 | Suzuki | H01R 13/2485 |
| | | | 439/296 |
| 2016/0118210 A1* | 4/2016 | Beroz | H01H 35/26 |
| | | | 200/81 R |
| 2017/0149165 A1* | 5/2017 | Tsai | H01R 13/5202 |
| 2018/0376610 A1 | 12/2018 | Kawabata | |

FOREIGN PATENT DOCUMENTS

| | | |
|---|---|---|
| CN | 203871520 U | 10/2014 |
| TW | M377746 | 4/2010 |
| TW | M377746 U | 4/2010 |
| TW | I331423 B | 10/2010 |
| TW | 201112505 | 4/2011 |
| TW | 201112505 A | 4/2011 |
| TW | I556084 B | 11/2016 |

OTHER PUBLICATIONS

Office Action for Korean Application No. KR20190069459, dated Apr. 13, 2020, 4 pages.

\* cited by examiner

ELECTRICAL CONNECTOR

CROSS-REFERENCE TO RELATED APPLICATIONS

This Patent Application claims priority of TW107114634 filed on Apr. 30, 2018. This Patent Application claims priority of CN201810474999.1 filed on May 17, 2018. The disclosure made in U.S. Pat. No. 7,989,945 to Williams et al., the disclosure made in the Patent Application TW107114634, and the disclosure made in the Patent Application CN201810474999.1 are hereby incorporated by reference.

FIELD OF THE INVENTION

This invention relates generally to an electrical connector. More particularly, the present invention relates to an electrical connector used in a testing apparatus.

BACKGROUND OF THE INVENTION

FIG. 1 shows a cross-sectional view of a conventional testing apparatus 9. The testing apparatus 9 facilitates testing of a device under test (DUT) 900. The DUT 900 can be any form of packaged integrated circuit (IC) derived from a wafer. The testing apparatus 9 includes a metal base 91 and a plurality of spring probes 92. During testing, the plurality of spring probes 92 are electrically connected to the DUT 900. The design of the testing apparatus 9 and locations of the plurality of spring probes 92 are determined based on the DUT 900. The type, size, and shape of DUT may vary which in turn requires various socket configurations to be considered. New test configurations result in specific testing apparatuses to be deployed to match DUT foot prints at the expense of additional manufacturing cost to the customer.

Current testing methods require the plurality of spring probes 92 that directly contact pads of the DUT 900 to test electrical signals. Certain testing methods further require a predetermined force to move the plurality of spring probes 92 so as to generate frictional motion relative to the contact pads of the DUT 900. Certain testing methods still further require a predetermined pressure applied to the contact interfaces between the plurality of spring probes 92 and the pads of the DUT 900.

One advantage of the electrical connector of the present disclosure is the group mounting capability so as to form a connector array. The connector array may be employed to test various electronic devices.

SUMMARY OF THE INVENTION

An electrical connector comprises a substrate, a datum reference position, a first electrical terminal, a second electrical terminal, a first plurality of intermediary members, a first plurality of contact members, a second plurality of intermediary members, and a second plurality of contact members. The first plurality of intermediary members is between the first electrical terminal and the datum reference position. The second plurality of intermediary members is between the second electrical terminal and the datum reference position.

A connector array comprises of one or more electrical connectors. A testing apparatus comprises a tester base, a supporting member, a connector registration frame, one or more connector arrays, and an upper cover.

DETAILED DESCRIPTION OF THE INVENTION

Figure 1:
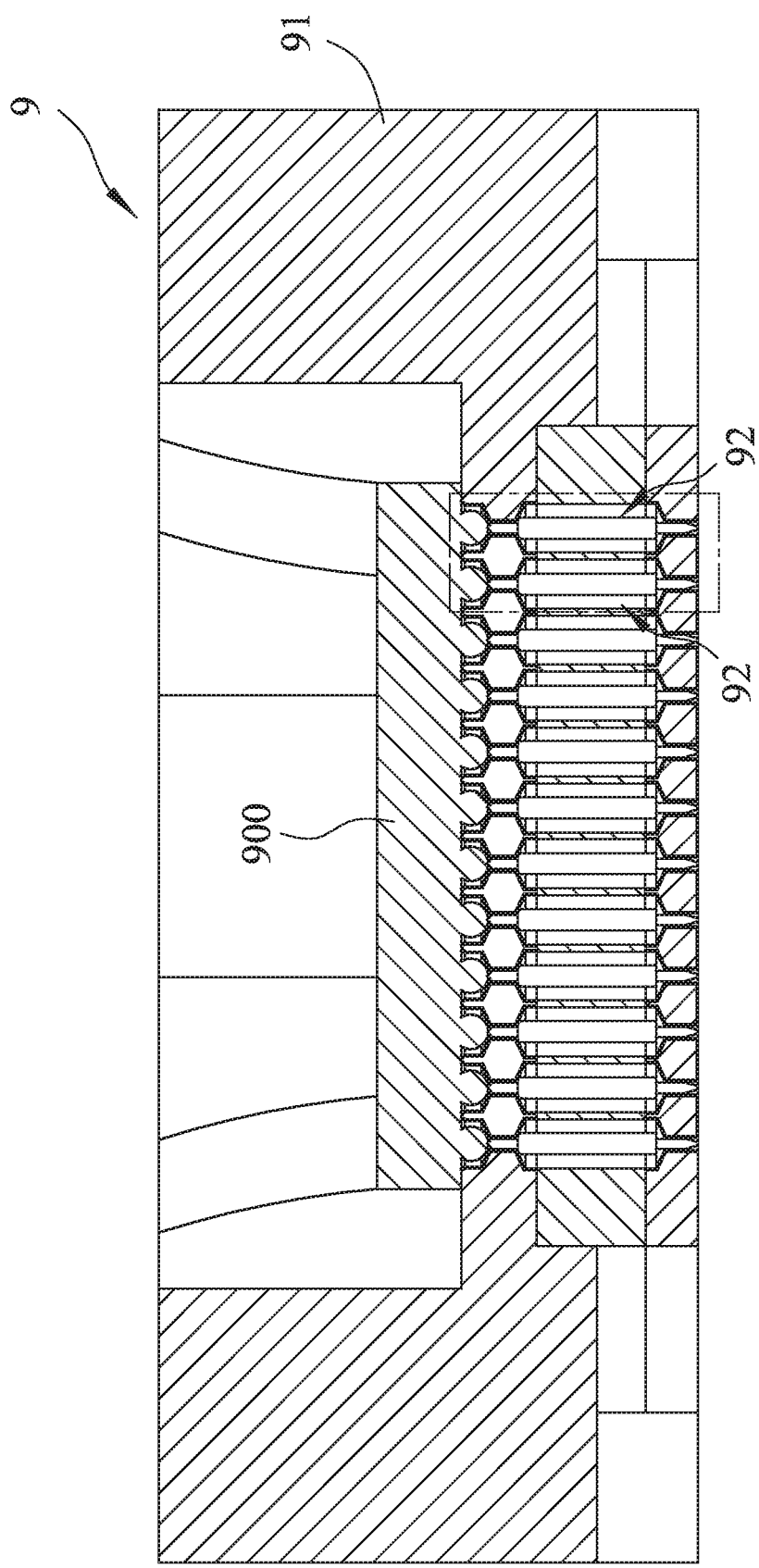
FIG. 1 is a cross-sectional view of a conventional testing apparatus.
Figure 2A:
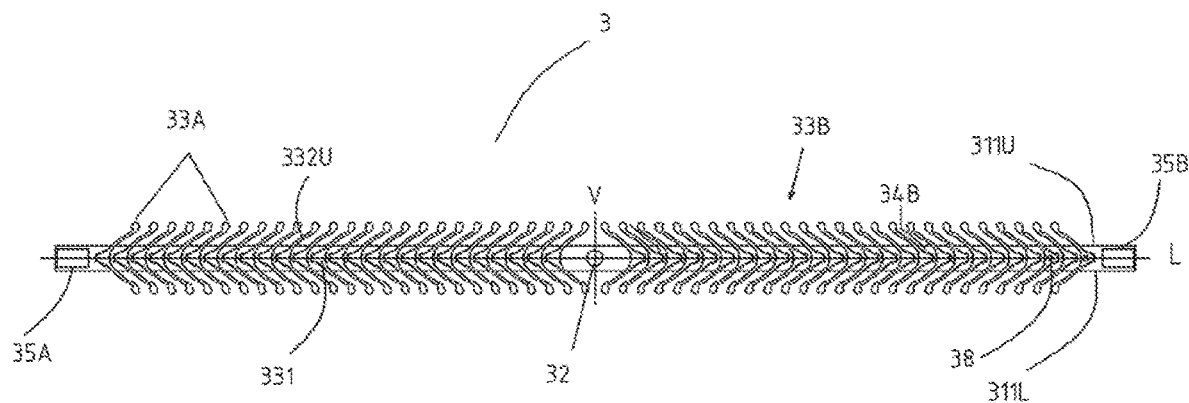
FIG. 2A is a front view.
Figure 2B:
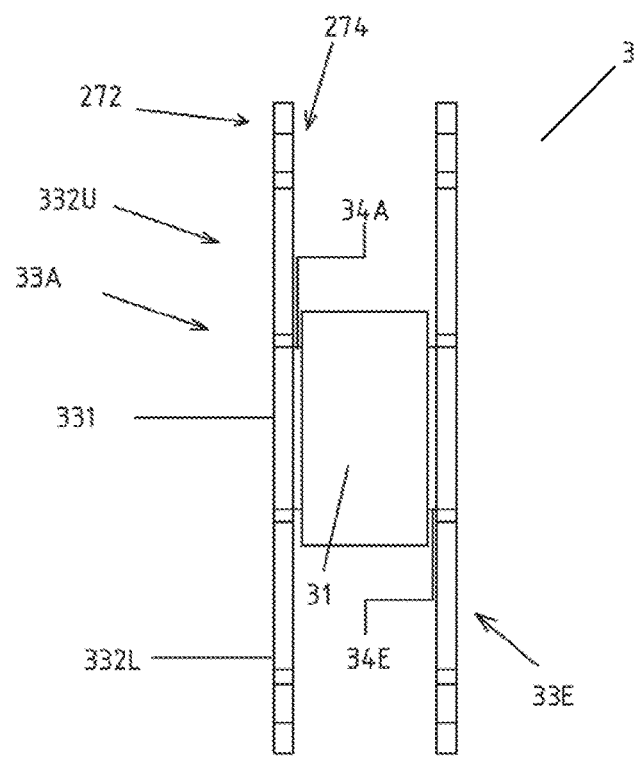
FIG. 2B is a side view of an electrical connector in examples of the present disclosure.

FIG. 2A is a front view, FIG. 2B is a side view of an electrical connector 3 in examples of the present disclosure. The electrical connector 3 comprises a substrate 31, a datum reference position 32, a first electrical terminal 35A, a second electrical terminal 35B, a first plurality of intermediary members 34A, a first plurality of contact members 33A, a second plurality of intermediary members 34B, and a second plurality of contact members 33B. The substrate 31 extends along a first direction (the L-direction in FIG. 2A). The datum reference position 32, the first plurality of intermediary members 34A, the second plurality of intermediary members 34B, the first electrical terminal 35A, and the second electrical terminal 35B are attached to the substrate 31. In examples of the present disclosure, the substrate 31 is made of an insulating material. The first plurality of intermediary members 34A and the second plurality of intermediary members 34B are made of a first conductive material. The first plurality of contact members 33A and the second plurality of contact members 33B are made of a second conductive material. The first electrical terminal 35A and the second electrical terminal 35B is made of the same conductive material as intermediary members 34A and 34B.

In examples of the present disclosure, the substrate 31 has a front surface, a first side surface 311U, a second side surface 311L and a back surface. The front surface is parallel to the back surface. The first side surface 311U is parallel to the second side surface 311L.

In examples of the present disclosure, the first plurality of intermediary members 34A and the second plurality of intermediary members 34B are directly attached to a front surface of the substrate 31. A pitch between a selected intermediary member of the first plurality of intermediary members 34A and an adjacent intermediary member of first plurality of intermediary members 34A is in a range from one hundred microns to one thousand microns.

In one example, the electrical connector 3 only has a first plurality of intermediary members 34A and a first plurality of contact members 33A formed on the front side of the substrate 31 (that is, the left-hand-side in FIG. 2B), without intermediary members 34E and contact members 33E formed on the back side of the substrate 31 (that is, the right-hand-side in FIG. 2B). In another example, the electrical connector 3 has a first plurality of intermediary members 34A and a first plurality of contact members 33A formed on the front side and intermediary members 34E and contact members 33E formed on the back side of the substrate 31.

The first plurality of intermediary members 34A is aligned along the first direction (the L-direction) between the first electrical terminal 35A and the datum reference position 32. The second plurality of intermediary members 34B is aligned along the first direction (the L-direction) between the second electrical terminal 35B and the datum reference position 32. The first plurality of contact members 33A are attached to the first plurality of intermediary members 34A. The first plurality of contact members 33A are aligned along the first direction (the L-direction) between the first electrical terminal 35A and the datum reference position 32. The second plurality of contact members 33B are attached to the second plurality of intermediary members 34B. The second plurality of contact members 33B are aligned along the first direction (the L-direction) between the second electrical terminal 35B and the datum reference position 32.

Figure 3A:
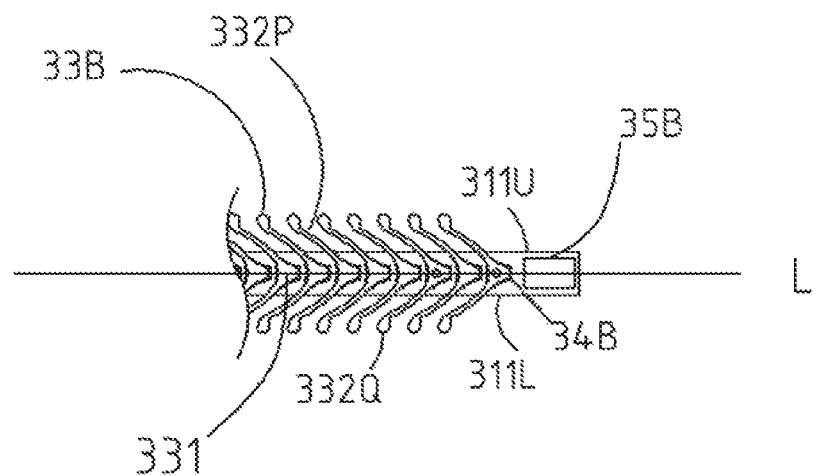
FIG. 3A is a partial front view of the electrical connector in examples of the present disclosure.

Each of the first plurality of contact members 33A comprises a first base 331, a first arm 332U and a second arm 332L. The first arm 332U extends away from the first base 331. The second arm 332L extends away from the first base 331. Similarly (see FIG. 3A), each of the second plurality of contact members 33B comprises a second base, a third arm 332P and a fourth arm 332Q. The third arm 332P extends away from the second base. The fourth arm 332Q extends away from the second base.

A plurality of top surfaces of the first plurality of contact members 33A and a plurality of top surfaces of the second plurality of contact members 33B are co-planar (on the plane 272 of FIG. 2B). A plurality of bottom surfaces of the first plurality of contact members 33A and a plurality of bottom surfaces of the second plurality of contact members 33B are co-planar (on the plane 274 of FIG. 2B).

The electrical connector 3 of FIG. 2A is symmetric with respect to a centerline of the electrical connector. The centerline is parallel to the first direction (the L-direction). The electrical connector 3 is symmetric with respect to a symmetric line (in the V-direction) of the electrical connector. The symmetric line is perpendicular to the centerline. The symmetric line passes through a centroid of the datum reference position 32.

Figure 3B:
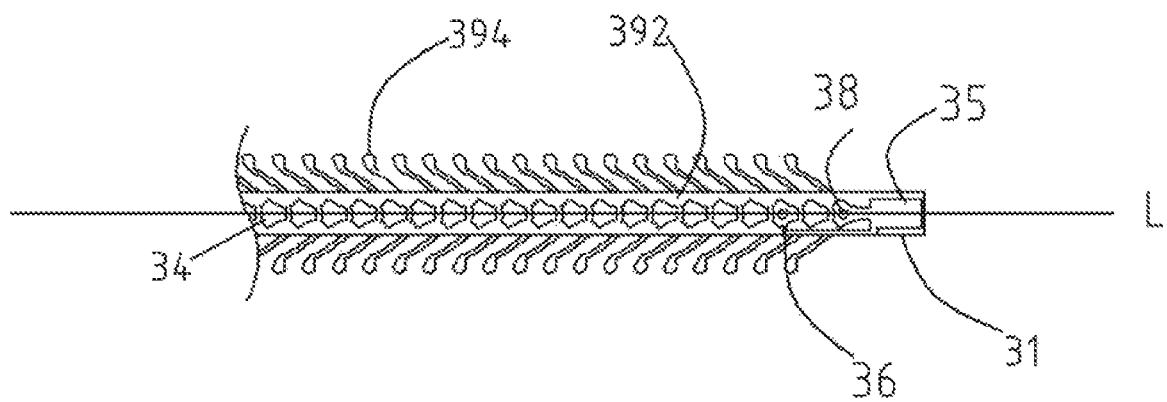
FIG. 3B is a partial front view of another electrical connector in examples of the present disclosure.

In one example, in FIG. 3B, each of the first arm, second arm, third arm, and fourth arm comprises a slender portion 392 and an end portion 394. A length of the slender portion 392 is larger than a length of the end portion 394. A width of the slender portion 392 is smaller than a width of the end portion 394. In FIG. 2A, each of the first plurality of contact members 33A is of a letter V shape. Each of the second plurality of contact members 33B is of the letter V shape. The datum reference position 32 is at an opening side of each of the letter V shapes (the opening of the letter V shape of each of the first plurality of contact members 33A toward right hand side and the opening of the letter V shape of each of the second plurality of contact members 33B toward left hand side) so that the direction of motion of the end portion 394 under pressure is pre-determined. From Symmetry, resultant force vectors at the ends of contact members 33A and 33B along the L direction sum to zero when end portions 394 are subjected to a loading force.

In yet another example, the datum reference position 32 may be located either on the outer most left-hand side or the outer most right-hand side of the outer most positioned contact member found along the front face of substrate 31 of given length L. The contact V shaped members on front surface of electrical connector 3 may face toward or away from this datum reference position. Contact members on the back face of electrical connector 3 may face toward or away from the datum reference position on the opposing substrate surface. Contact members fabricated in this orientation will result in a differential or biasing force supplied to contact electrical connector 3 when end portions 394 are subjected to a loading force.

In examples of the present disclosure, the slender portion 392 is of a first circular arc shape. A radius of the first circular arc shape is in a range between one times to ten times of a width of the substrate 31 so that a spring stiffness of the slender portion 392 and strength is balanced. A portion of the end portion 394 is of a second circular arc shape. The radius of the first circular arc shape is in a range between five times to twenty-five times of a radius of the second circular arc shape so that contact stiffness of the end portion 394 and strength is balanced.

Figure 4A:
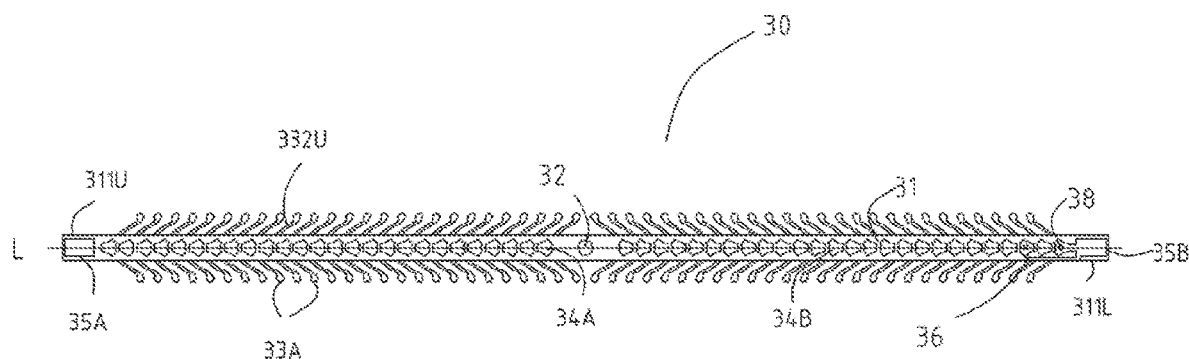
FIG. 4A is a front view of a circuitized connector array in examples of the present disclosure.

In one example, in FIG. 4A, a selected contact member of the second plurality of contact members 33B is electrically and mechanically connected to the second electrical terminal 35B through a via 38 and a trace 36.

Figure 4B:
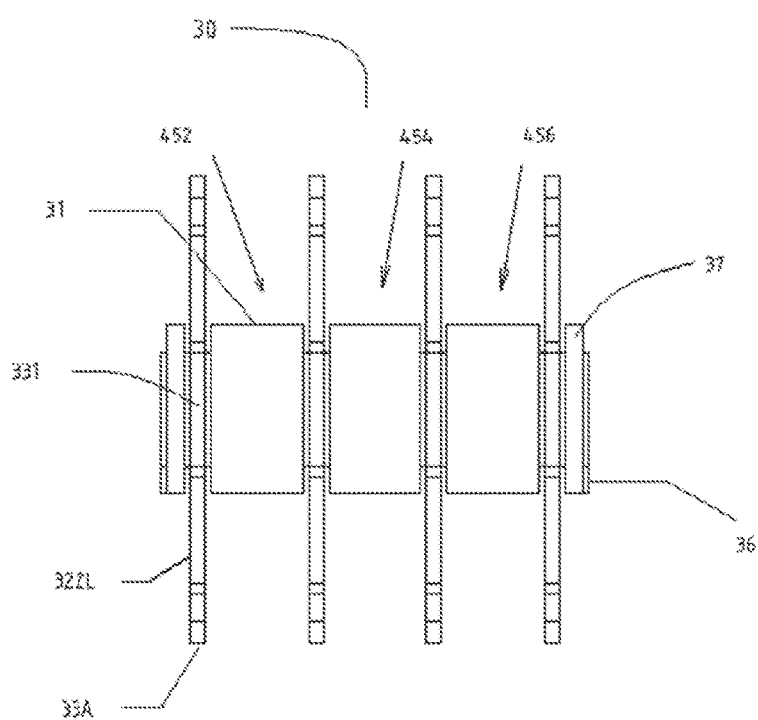
FIG. 4B is a side view of a connector array in examples of the present disclosure.
Figure 5:
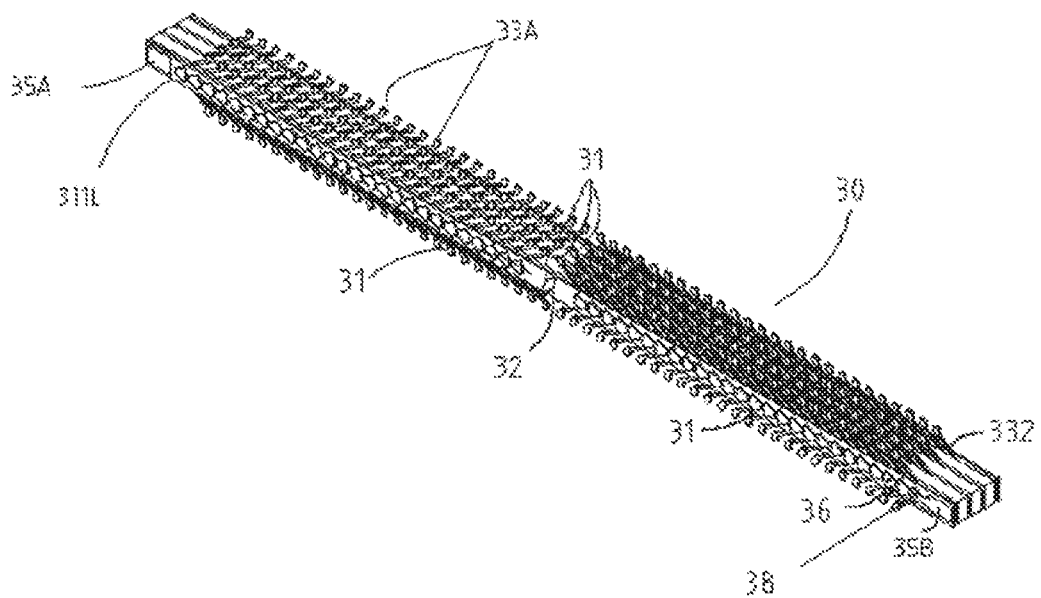
FIG. 5 is a perspective view of a circuitized connector array in examples of the present disclosure.

In FIGS. 4A, 4B and 5, a connector array 30 comprises one or more of the electrical connectors of FIG. 2A or FIG. 2B. The connector array 30 includes a first electrical connector 452, a second electrical connector 456, and a dielectric substrate 454 separating the first electrical connector 452 and the second electrical connector 456. A dielectric capping end member 37 encloses the structure. A distance between the first electrical connector 452 and the second electrical connector 456 is the same as a distance found between the first electrical connector 452 and the second electrical connector 456.

Figure 6:
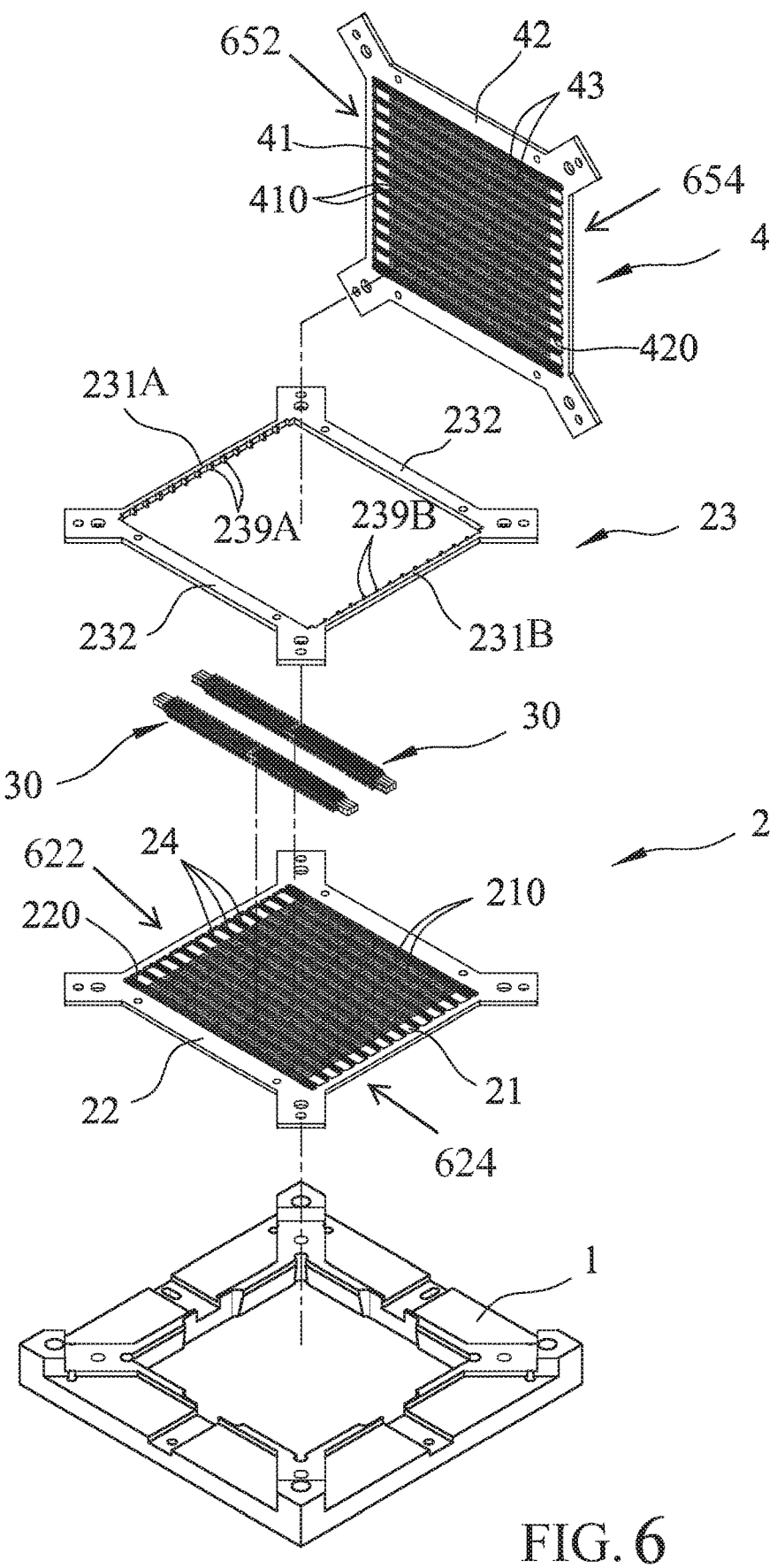
FIG. 6 is an exploded plot of a testing apparatus in examples of the present disclosure.
Figure 7:
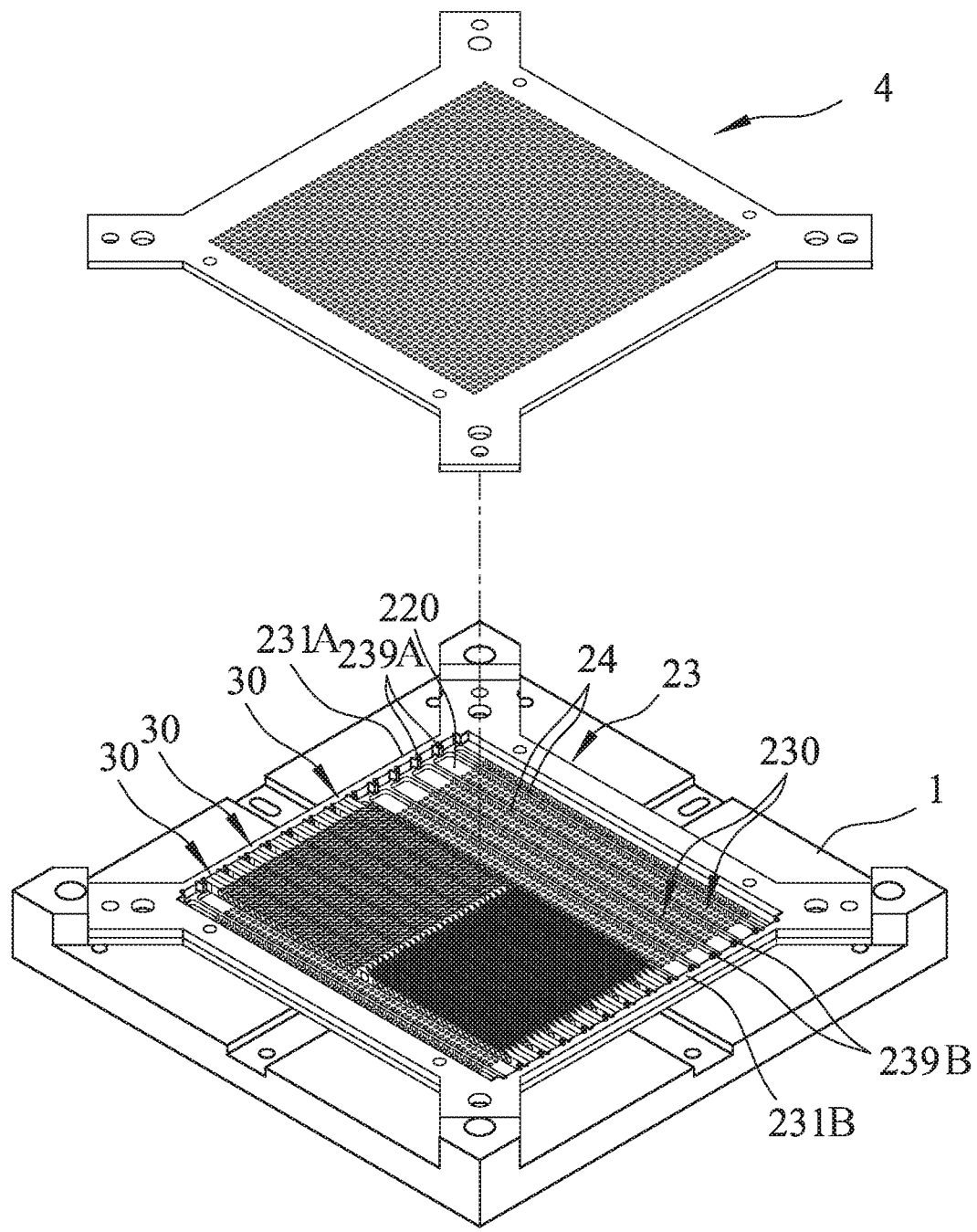
FIG. 7 is an exploded partially assembled plot of the apparatus shown in FIG. 6 in examples of the present disclosure.
Figure 8:
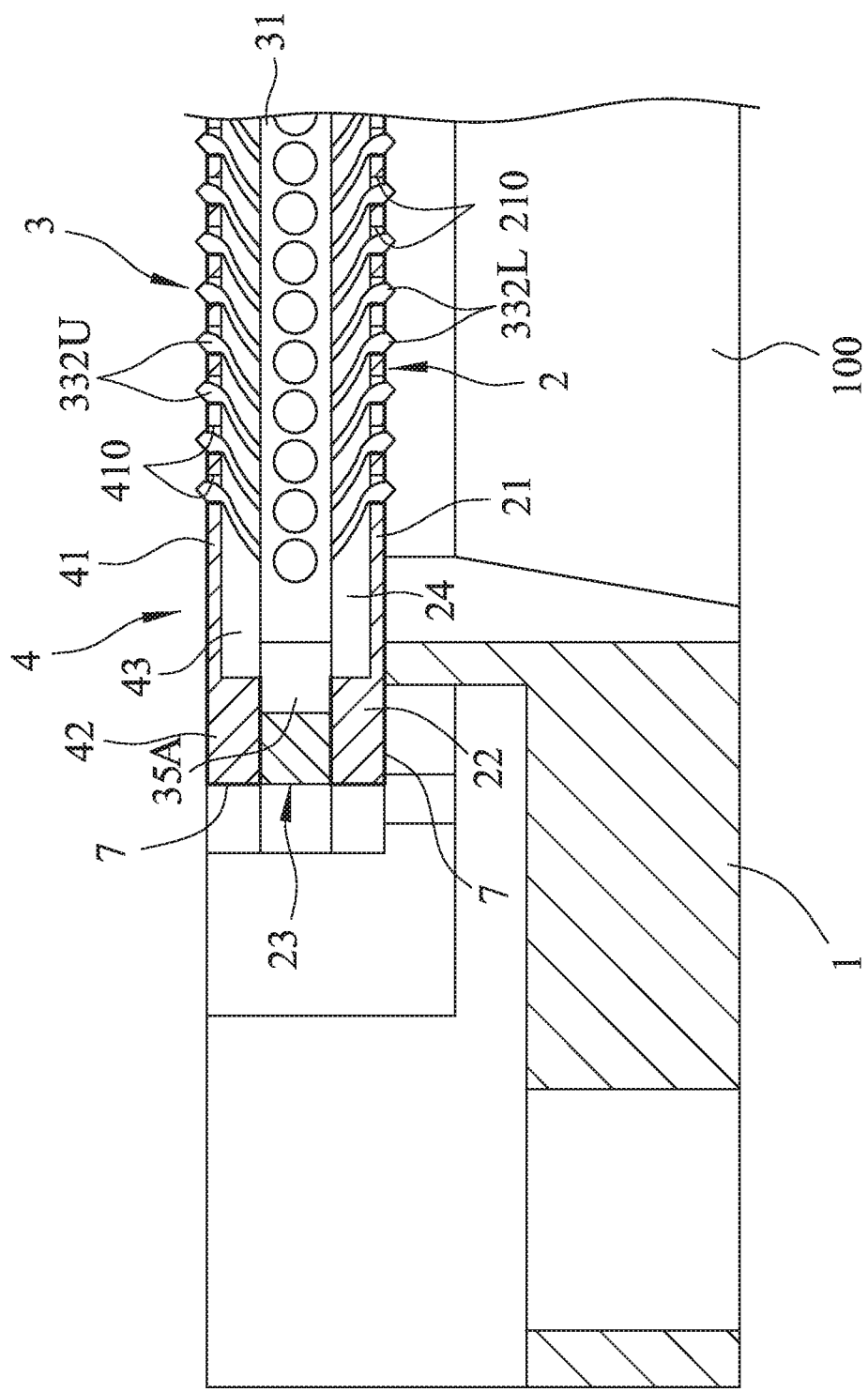
FIG. 8 is an exploded partial cross-sectional view of still another testing apparatus in examples of the present disclosure.

In FIGS. 6, 7 and 8, a testing apparatus comprises a tester base 1, a supporting member 2, a frame 23 (an intermediary connector registration frame), one or more of the connector arrays 30 of FIG. 5, and an upper cover 4. The supporting member 2 is attached to the tester base 1. The connector alignment the frame 23 is attached to the (lower) supporting member 2. The upper cover 4 is attached to the (alignment) frame 23. The upper cover 4 comprises a plurality of cover holes 410. The supporting member 2 comprises a panel 21 comprising a plurality of through holes 210, a first side band 622, a second side band 624 opposite the first side band 622 and a plurality of ribs 24. The surrounding side bands 22 encloses a recessed volume 220. The plurality of ribs 24 extend along the first direction (the L-direction). A first end of each of the plurality of ribs 24 is directly attached to the first side band 622. A second end of each of the plurality of ribs 24 is directly attached to the second side band 624.

The frame 23 is attached to the supporting member 2. The frame 23 comprises a first frame band 231A, a second frame band 231B opposite the first frame band 231A, a first plurality of protrusions 239A and a second plurality of protrusions 239B. The first plurality of protrusions 239A extend away from the first frame band 231A along the first direction (the L-direction). The second plurality of protrusions 239B extend away from the second frame band 231B along the first direction (the L-direction).

Each of the second arm 332L of the first plurality of contact members is disposed in a respective through hole of the plurality of through holes 210 of the panel 21 of the supporting member 2. Each of the fourth arm of the second plurality of contact members is disposed in a respective through hole of the plurality of through holes 210 of the panel 21 of the supporting member 2.

Each of the first arm 332U of the first plurality of contact members is disposed in a respective cover hole of the plurality of cover holes 410 of the upper cover 4. Each of the third arm of the second plurality of contact members is disposed in a respective cover hole of the plurality of cover holes 410 of the upper cover 4.

One or more of the connector arrays 30 are mounted on top of the plurality of ribs 24. Each of the one or more of the connector arrays 30 is separated from an adjacent connector array of the one or more of the connector arrays 30 by a respective protrusion of the first plurality of protrusions 239A and a respective protrusion of the second plurality of protrusions 239B.

The upper cover 4 further comprises a cover panel 41, a cover surrounding band 42 enclosing a cover recessed volume 420, a first cover band 652, a second cover band 654 opposite the first cover band 652 and a plurality of cover ribs 43. The plurality of cover ribs 43 extend along the first direction (the L-direction). A first end of each of the plurality of cover ribs 43 is directly attached to the first cover band 652. A second end of each of the plurality of cover ribs 43 is directly attached to the second cover band 654.

The first electrical terminal 35A contacts the first side band 622 of the supporting member 2 and contacts the first plurality of protrusions 239A of the frame 23. The second electrical terminal 35B contacts the second side band 624 of the supporting member 2 and contacts the second plurality of protrusions 239B of the frame 23.

When assembled to tester base 1, the plurality of ribs 24 found in supporting member 2 and the plurality of cover ribs 43 found in the upper cover 4, sandwich and restrict the connector 30 from bending during the normal operation of the test apparatus.

Figure 9:
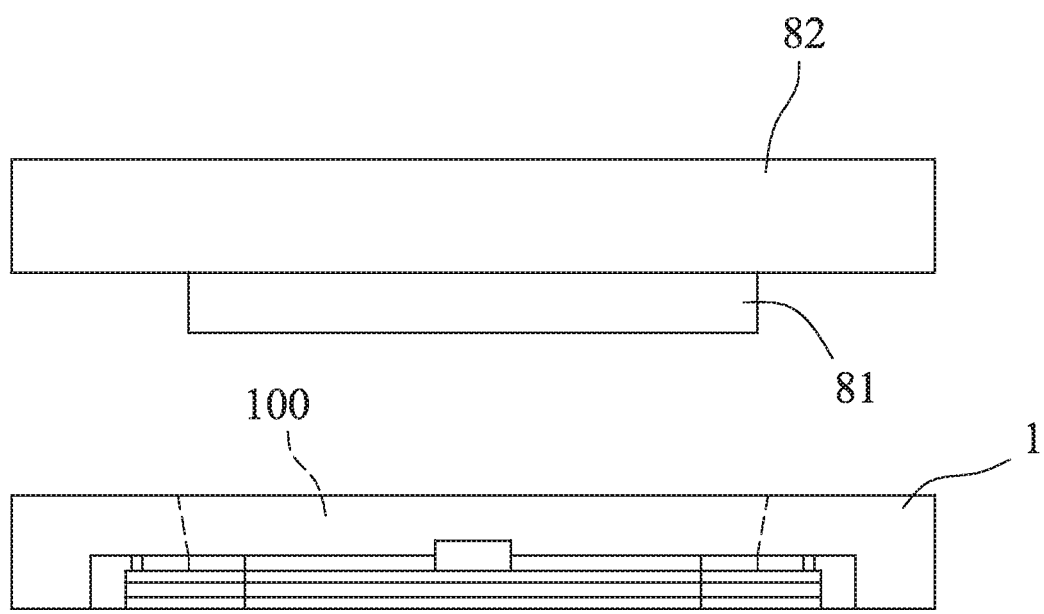
FIG. 9 is a side view of yet another testing apparatus in examples of the present disclosure.

In examples of the present disclosure, the present disclosure is applied to a package on package (POP) test. In FIGS. 8 and 9, a device under test (DUT) 81 is attached to a station 82. After integrating the station 82 with the tester base 1, a cavity is formed. Electrical signals from the station 82 and the tester base 1 will be used to determine if the DUT 81 passes or fails the test.

Figure 10:
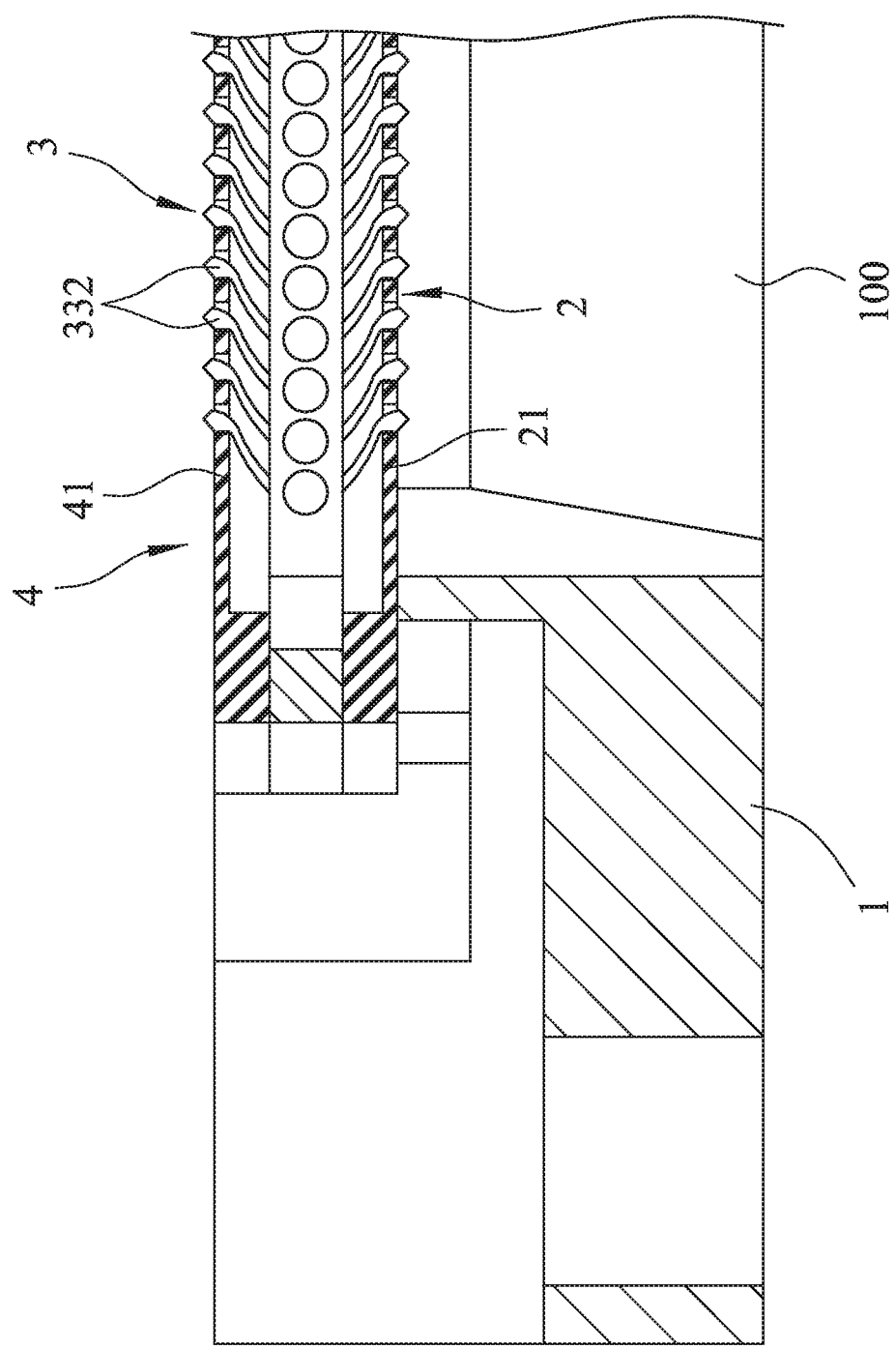
FIG. 10 is an exploded partial cross-sectional view of yet still another testing apparatus in examples of the present disclosure.

In one example, in FIG. 10, an entire surface of the tester base 1 and an entire surface of the upper cover 4 are covered with insulation coatings. In another example, the tester base 1 and the upper cover 4 are made of another insulating material. In still another example, the panel 21 and the cover panel 41 of the upper cover 4 are made of another insulating material.

Those of ordinary skill in the art may recognize that modifications of the embodiments disclosed herein are possible. For example, a total number of electrical connectors in a connector array may vary. Other modifications may occur to those of ordinary skill in this art, and all such modifications are deemed to fall within the purview of the present invention, as defined by the claims.

The invention claimed is:

1. An electrical connector comprising:
    a substrate made of an insulating material, the substrate having a front surface extending along a first direction between a first end and a second end and having opposing first and second side surfaces in a direction perpendicular to the first direction, the substrate having a datum reference position centrally positioned on the substrate;
    a first plurality of intermediary members attached to the front surface of the substrate, the first plurality of intermediary members being made of a first conductive material, the first plurality of intermediary members being aligned along the first direction between the first end and the datum reference position;
    a first plurality of contact members attached to the first plurality of intermediary members, the first plurality of contact members being made of a second conductive material, the first plurality of contact members being aligned along the first direction between the first end and the datum reference position;
wherein each of the first plurality of contact members comprises a first base;
a first arm extending away from the first base towards the first side surface;
a second arm extending away from the first base towards the second side surface, opposite the first side surface, wherein the first arm and the second arm of each contact member forming a letter V shape on the front surface of the substrate with an opening of the letter V facing the datum reference position,
wherein each of the first arm and second arm comprises
    a slender portion; and an end portion;
wherein a length of the slender portion is larger than a length of the end portion; wherein a width of the slender portion is smaller than a width of the end portion.

2. The electrical connector of claim 1, wherein the slender portion is of a first circular arc shape;
    wherein a radius of the first circular arc shape is in a range between one times to ten times of a width of the substrate;
    wherein a portion of the end portion is of a second circular arc shape; and wherein the radius of the first circular arc shape is in a range between five times to twenty-five times of a radius of the second circular arc shape.

3. The electrical connector of claim 1, wherein the first plurality of intermediary members are directly attached to the front surface of the substrate; and
    wherein a pitch between a selected intermediary member of the first plurality of intermediary members and an adjacent intermediary member of the first plurality of intermediary members is in a range from one hundred microns to one thousand microns.

4. The electrical connector of claim 1, further comprising a
    first electrical terminal attached to the first end of the substrate, wherein the first electrical terminal is made of a third conductive material; and wherein a selected contact member of the first plurality of contact members is electrically and mechanically connected to the first electrical terminal through a via and a trace.

5. The electrical connector of claim 4, wherein the first plurality of contact members extend outwardly from the first side surface of the substrate to form a top surface that is co-planar; and
    wherein the first plurality of contact members extend outwardly from the second side surface of the substrate to form a bottom surface that is co-planar.

6. The electrical connector of claim 5, wherein the electrical connector is symmetric with respect to a centerline of the electrical connector;

wherein the centerline is parallel to the first direction.

7. The electrical connector of claim 1, further comprising:
a second plurality of intermediary members attached to the substrate, the second plurality of intermediary members being made of the first conductive material, the second plurality of intermediary members being aligned along the first direction between the second end and the datum reference position; and
a second plurality of contact members attached to the second plurality of intermediary members, the second plurality of contact members being made of the second conductive material, the second plurality of contact members being aligned along the first direction between the second end and the datum reference position;
wherein each of the second plurality of contact members comprises
a second base;
a third arm extending away from the second base towards the first side surface; and
a fourth arm extending away from the second base towards the second side surface, opposite the first side surface, wherein the third arm and the fourth arm of each contact member forming the letter V shape on the front surface of the substrate with the opening of the letter V facing the datum reference position;
wherein the electrical connector is symmetric with respect to a symmetric line of the electrical connector, the symmetric line being perpendicular to the first direction passing through a centroid of the datum reference position.

8. A connector array comprising two or more of the electrical connectors of claim 6, the connector array including:
a first electrical connector; and
a second electrical connector;
wherein the first electrical connector and the second electrical connector are separated by a dielectric substrate.

9. An electrical connector, comprising:
a substrate extending along a longitudinal axis and having two lateral sides spaced apart from and parallel to each other along said longitudinal axis, said substrate being made of an insulating material;
a datum reference position that is centrally positioned on said substrate; and
a plurality of contact members that are positioned on said substrate and that are arranged spaced apart from one another along said longitudinal axis, each of said contact members being made of an electrically conductive material, and having a base portion, and two arm portions that extend oppositely from said base portion away from said longitudinal axis and that are located outwardly of said respective lateral sides of said substrate, said arm portions of said contact members inclinedly extending towards said datum reference position and being deformable towards said substrate.

10. The electrical connector of claim 9, further comprising two electrical terminals respectively formed on two opposite ends of said substrate, each of said two electrical terminals being made of an electrically conductive material.

11. The electrical connector of claim 9, further comprising a plurality of intermediary members formed between said contact members and said substrate such that said contact members are spaced apart from said substrate by a distance, said plurality of intermediary members being made of an electrically conductive material.

12. The electrical connector of claim 9, wherein the plurality of contact members have arm portions extending from respective base portions, and the arm portions of the plurality of contact members extend from the respective base portions to form a front surface that is co-planar.

13. The electrical connector of claim 10, wherein a first contact member of the plurality of contact members is electrically and mechanically connected to one of the electrical terminals through a via and a conductive trace.

14. The electrical connector of claim 11, wherein a pitch between a selected intermediary member of the plurality of intermediary members and an adjacent intermediary member of the plurality of intermediary members is in a range from one hundred microns to one thousand microns.

* * * * *